United States Patent
Sugiyama et al.

(10) Patent No.: US 9,543,146 B2
(45) Date of Patent: Jan. 10, 2017

(54) MANUFACTURING METHOD OF SEMICONDUCTOR DEVICE THAT INCLUDES FORMING PLURAL NITRIDE SEMICONDUCTOR LAYERS OF IDENTICAL MATERIAL

(71) Applicant: Kabushiki Kaisha Toshiba, Minato-ku, Tokyo (JP)

(72) Inventors: Naoharu Sugiyama, Komatsu Ishikawa (JP); Yasuhiro Isobe, Kanazawa Ishikawa (JP); Hung Hung, Nonoichi Ishikawa (JP); Akira Yoshioka, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/842,191

(22) Filed: Sep. 1, 2015

(65) Prior Publication Data
US 2016/0268130 A1    Sep. 15, 2016

(30) Foreign Application Priority Data
Mar. 12, 2015   (JP) .................................. 2015-049736

(51) Int. Cl.
| | |
|---|---|
| *H01L 21/205* | (2006.01) |
| *H01L 33/32* | (2010.01) |
| *H01L 21/02* | (2006.01) |
| *H01L 33/00* | (2010.01) |

(52) U.S. Cl.
CPC ..... *H01L 21/02694* (2013.01); *H01L 21/0254* (2013.01); *H01L 21/02381* (2013.01); *H01L 21/02458* (2013.01); *H01L 21/2056* (2013.01); *H01L 33/007* (2013.01)

(58) Field of Classification Search
CPC .................... H01L 21/02389; H01L 21/02458; H01L 21/0254; H01L 21/02694; H01L 21/2015; H01L 21/2056; H01L 21/3245; H01L 33/007; H01L 33/0075; H01L 33/32
See application file for complete search history.

(56) References Cited

U.S. PATENT DOCUMENTS

2003/0232457 A1* 12/2003 Kawaguchi ............. C30B 25/02
                                                                    438/46
2006/0228901 A1   10/2006 Yoon et al.
(Continued)

FOREIGN PATENT DOCUMENTS

| JP | 2007-528587 A | 10/2007 |
|---|---|---|
| JP | 5005266 B2 | 8/2012 |
| JP | 5127978 B1 | 1/2013 |

*Primary Examiner* — Stephen W Smoot
(74) *Attorney, Agent, or Firm* — White & Case LLP

(57) ABSTRACT

According to one embodiment, a manufacturing method of a semiconductor device, comprising: forming a first nitride semiconductor layer on a substrate using a first temperature; decreasing a substrate temperature to a second temperature lower than the first temperature, after the forming the first nitride semiconductor layer; forming a second nitride semiconductor layer on the first nitride semiconductor layer using the second temperature; increasing the substrate temperature to a third temperature higher than the first temperature, after the forming the second nitride semiconductor layer; and forming a third nitride semiconductor layer on the second nitride semiconductor layer using the third temperature.

20 Claims, 7 Drawing Sheets

(56) References Cited

U.S. PATENT DOCUMENTS

| | | | |
|---|---|---|---|
| 2008/0142781 A1* | 6/2008 | Lee | H01L 33/12 257/13 |
| 2008/0233721 A1* | 9/2008 | Kosaka | H01L 21/0237 438/493 |
| 2012/0104360 A1* | 5/2012 | Hardy | H01L 21/02389 257/18 |
| 2013/0062612 A1 | 3/2013 | Shioda et al. | |
| 2013/0087762 A1* | 4/2013 | Hung | H01L 29/778 257/13 |
| 2014/0077239 A1* | 3/2014 | Hung | H01L 21/02458 257/94 |
| 2014/0110754 A1* | 4/2014 | Jain | H01L 21/0237 257/190 |
| 2014/0138614 A1* | 5/2014 | Sugiyama | B82Y 20/00 257/13 |
| 2016/0190387 A1* | 6/2016 | Sun | H01L 33/0075 438/47 |

\* cited by examiner

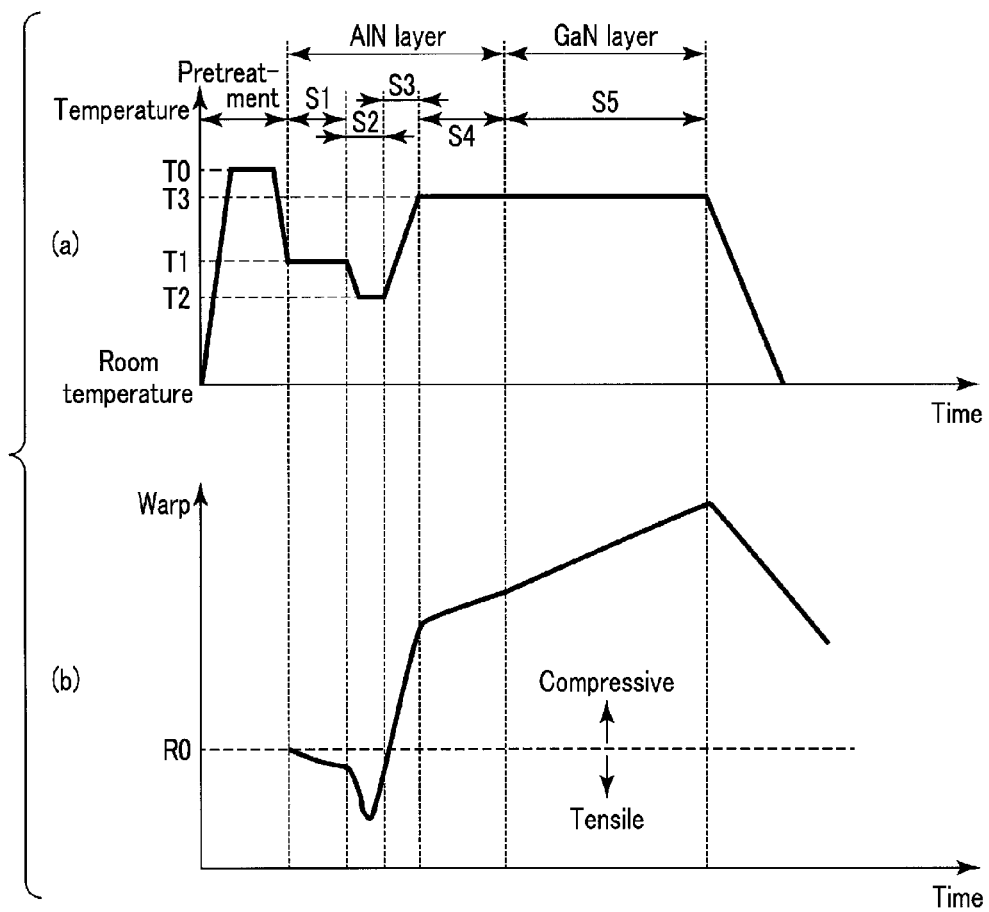
F I G. 4
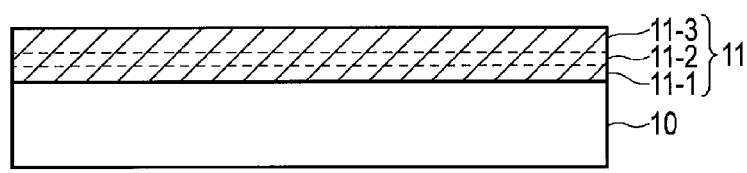
F I G. 5

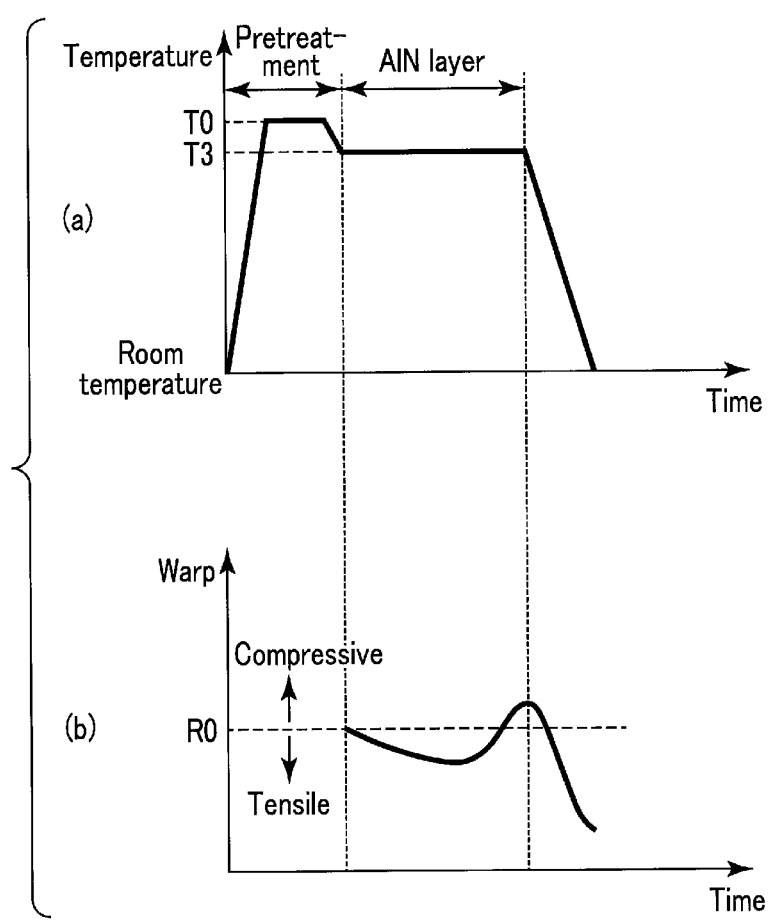
F I G. 9

MANUFACTURING METHOD OF SEMICONDUCTOR DEVICE THAT INCLUDES FORMING PLURAL NITRIDE SEMICONDUCTOR LAYERS OF IDENTICAL MATERIAL

CROSS-REFERENCE TO RELATED APPLICATIONS

This application is based upon and claims the benefit of priority from Japanese Patent Application No. 2015-049736, filed Mar. 12, 2015, the entire contents of which are incorporated herein by reference.

FIELD

Embodiments described herein relate generally to a manufacturing method of a semiconductor device, in particular, a manufacturing method of a semiconductor device using a compound semiconductor.

BACKGROUND

Electronic devices using a nitride semiconductor are used for high-speed electronic devices and power devices. Light emitting diodes (LEDs) being semiconductor light emitting elements using a nitride semiconductor are used for display devices and lighting.

Formation of such nitride semiconductor elements on a silicon (Si) substrate with excellent mass productivity may easily cause faults or cracks due to differences in lattice constant or thermal expansion coefficient between a nitride semiconductor and silicon (Si). A technique is required to prepare nitride semiconductor crystals of high quality.

BRIEF DESCRIPTION OF THE DRAWINGS

FIG. 4 is a diagram for explaining a manufacturing method of a semiconductor device according to a first embodiment;

FIG. 5 is a cross-sectional view for explaining a manufacturing step of the semiconductor device according to the first embodiment;

FIG. 9 is a diagram for explaining a manufacturing method of a semiconductor device according to a comparative example;

DETAILED DESCRIPTION

Figure 1:
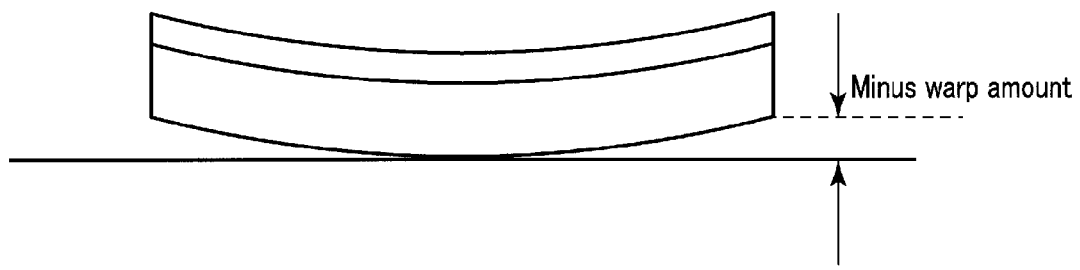
FIG. 1 is a schematic diagram for explaining a warp in a substrate.

In general, according to one embodiment, there is provided a manufacturing method of a semiconductor device, comprising:

forming a first nitride semiconductor layer on a substrate using a first temperature;

decreasing a substrate temperature to a second temperature lower than the first temperature, after the forming the first nitride semiconductor layer;

forming a second nitride semiconductor layer on the first nitride semiconductor layer using the second temperature, the second nitride semiconductor layer formed of a material identical to a material of the first nitride semiconductor layer;

increasing the substrate temperature to a third temperature higher than the first temperature, after the forming the second nitride semiconductor layer; and forming a third nitride semiconductor layer on the second nitride semiconductor layer using the third temperature, the third nitride semiconductor layer formed of a material identical to the material of the first nitride semiconductor layer.

Embodiments will be explained hereinafter with reference to drawings. However, the drawings are schematic and conceptual drawings, and the dimensions and the ratio in each of the drawings are not necessarily identical to actual ones. Some embodiments described hereinafter illustrate devices and methods for materializing the technical idea of the present invention, and do not specify the technical idea of the present invention by the shapes, structures, or arrangement of the constituent elements. In the following explanation, constituent elements having the same function and structure are denoted by the same reference numeral, and overlapping explanation thereof will be made only when necessary.

(Definition of Warp and Explanation of Measuring Method)

Figure 2:
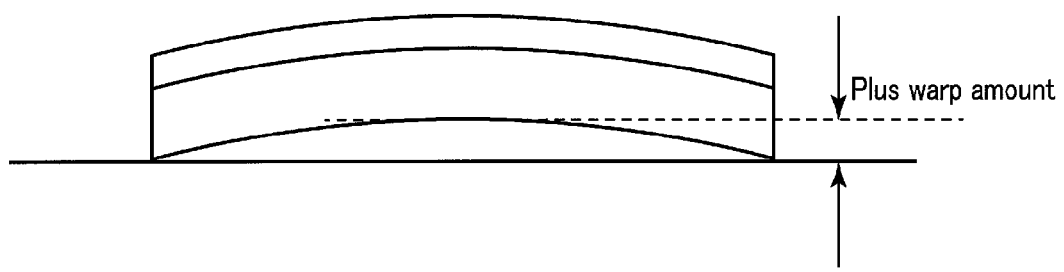
FIG. 2 is a schematic diagram for explaining a warp in a substrate.

The magnitude of a warp is defined as follows. When a substrate having a concave shape is placed on a flat surface, the substrate is in the state where the bottom of the concavity contacts the flat surface and the edges of the substrate float (FIG. 1). In this state, the magnitude (length) of floating (separation) of the edges of the substrate from the flat surface is defined as a minus (−) warp amount. By contrast, in the case of placing a substrate having a convex shape, the substrate is in the state where the edges of the substrate contact the flat surface and the center portion thereof floats (FIG. 2). In this state, the floating distance of the center portion from the flat surface is defined as a plus (+) warp amount.

Based on the above definitions, it is necessary to fix the size of the substrate under discussion, because the magnitude of the warp varies according to the size (diameter) of the substrate to be handled even when the warp is caused by the same internal stress. Generally, a warp amount of a substrate becomes four times as large as the original warp amount when the substrate size (diameter) of the substrate becomes twice as large as the original size. In addition, because the definitions of plus and minus differ according to the circumstances, the definitions should be checked each time. In the following discussion, the substrate size is fixed based on supposition, and change in the magnitude of the warp is discussed based on the supposition that a plus warp is a warp caused by compressive stress applied into a film formed on the substrate to become a convex shape, and a minus warp is a warp caused by tensile stress applied into the film formed on the substrate to become a concave shape.

Figure 3:
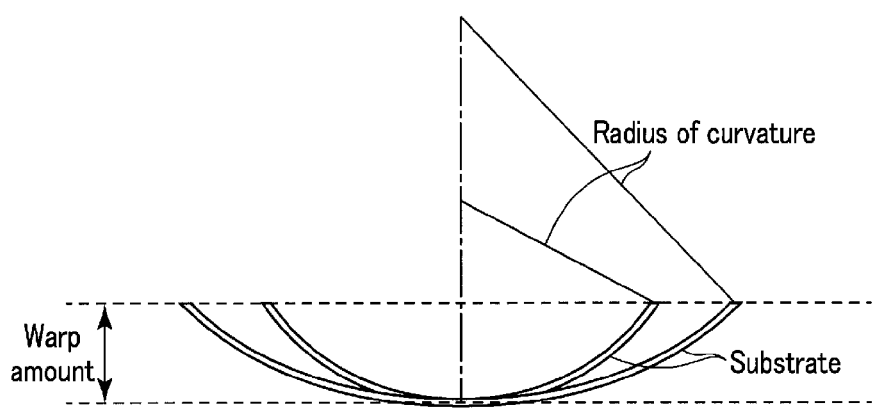
FIG. 3 is a schematic diagram for explaining a warp in a substrate.

An example of another method of defining the warp amount is an index using a radius of curvature (FIG. 3). This is a method of expressing a radius from the center of the sphere as an index, based on the supposition that the warp shape of the substrate that is warped by application of stress is a spherical shape. In this method, the radius of curvature is equal regardless of the diameter of the substrate, as long as the same internal stress is applied to the formed film. However, it is difficult to adapt the method to the case where the warp shape is not spherical.

The magnitude of the warp can be measured by scanning laser light and measuring the reflected light.

The following embodiments relate to a semiconductor device using a nitride semiconductor being a type of a compound semiconductor. The semiconductor device according to the embodiments includes semiconductor light emitting elements, semiconductor light receiving elements, and electronic devices. The semiconductor light emitting elements include light-emitting diodes (LED), and laser diodes (LD), and the like. The semiconductor light receiving elements include photo diodes (PD) and the like. The electronic devices include field effect transistors (FET), heterojunction field effect transistors (HFET), high electron mobility transistors (HEMT), heterojunction bipolar transistors (HBT), IGBT (insulated gate bipolar transistors), and schottky-barrier diodes (SBD) and the like.

First Embodiment

A manufacturing method of a semiconductor device 1 according to a first embodiment will be explained hereinafter with reference to drawings. FIG. 4 is a diagram for explaining a manufacturing method of the semiconductor device 1 according to the first embodiment. FIG. 4 illustrates the temperature used in the manufacturing process, and warp in the semiconductor device 1. The warp RO illustrated in FIG. 4 is a standard state (the warp is substantially zero), and corresponds to a warp in the substrate itself at room temperature (for example, the ambient temperature before heating treatment in the manufacturing process). The region lower than the reference RO indicates a state where the substrate becomes a concave shape due to tensile stress, and the region upper than the reference RO indicates a state where the substrate becomes a convex shape due to compressive stress.

The film formation process explained hereinafter is performed by, for example, epitaxial growth using a metal organic chemical vapor deposition (MOCVD). Specifically, a wafer stage on which a substrate is placed is introduced into a reactor (film deposition furnace). Then, the wafer stage is heated, and a source gas is supplied into the reactor while the temperature of the substrate is controlled. The temperature illustrated in FIG. 4 is a growth temperature (film formation temperature) in film formation, specifically, the temperature of the substrate achieved by heat treatment.

First, as illustrated in FIG. 5, a substrate 10 is prepared. The substrate 10 is formed of a silicon (Si) substrate having (111)-orientation as a principal surface. A material such as sapphire ($Al_2O_3$), silicon carbide (SiC), gallium phosphide (GaP), indium phosphide (InP), and a gallium arsenide (GaAs) may be used as the substrate 10. A substrate including an insulating layer may be used as the substrate 10. For example, a silicon on insulator (SOI) substrate may be used as the substrate 10. The substrate 10 is not limited to the examples mentioned above, but may be formed of any material as long as the substrate includes a single crystal layer on which an epitaxial layer can be grown, on a surface thereof.

When a nitride semiconductor crystal layer such as a GaN and an aluminum nitride (AlN) is stacked on a substrate formed of a crystal material other than gallium nitride (GaN), because a difference in thermal expansion coefficient exists between the nitride semiconductor crystals and the substrate material, stress strain is applied in the steps of increasing the temperature and decreasing the temperature accompanying film formation, and a warp occurs in the substrate. When a large warp occurs, a crack may occur, in particular, on the side of the substrate to which tensile strain is applied, and the whole substrate may be broken. When the substrate has a large warp even when the crack is slight, a trouble may occur in the semiconductor manufacturing process such as lithography, and it may become impossible to form devices with high reliability and at high yield. In particular, when Si is used as the substrate, tensile strain is applied to the GaN thin-film crystal layer due to its equivalent lattice constant larger than that of GaN. In addition, because the thermal expansion coefficient of GaN is substantially twice as large as that of Si, a larger tensile stress is applied to the substrate (a large downward warp occurs) in the step of decreasing the temperature after the film formation step at 1000° C. or more is finished.

A method is used to avoid this problem. In the method, an AlN crystal layer that has a lattice constant slightly smaller than that of the GaN crystal layer is used as an underlayer of the GaN growth layer, to contain compressive strain in the GaN layer to be stacked thereon, and counteract tensile stress during the decrease in temperature. When a GaN layer is stacked on the AlN underlayer by this method, an upward warp is generated by application of compressive stress to the GaN layer side in film formation. When the stress accumulated in the film formation is large, the stress can counteract the tensile stress occurring in the step of decreasing the temperature after the film formation step is finished, and the compressive stress is left by offset to maintain the upward warp.

In the conventional art, when a GaN layer is stacked on an Si substrate, a structure is adopted to insert an AlN layer between them to suppress melt-back reaction between Ga and Al. This structure can be adopted to control stress of the GaN crystal layer with an AlN crystal layer and achieve a good matching property. However, the AlN crystal layer stacked on the Si substrate may incur tensile stress due to a difference in equivalent lattice constant from the Si crystals, and sufficient compressive stress may not be applied to the GaN layer stacked thereon. To apply sufficient compressive stress to the GaN layer, it is desirable to use a crystal layer including remaining tensile stress as less as possible and including compressive stress as much as possible, as the AlN crystal layer to be used as the underlayer. In the present embodiment, the problem in the film formation process to apply compressive stress as large as possible to the GaN layer being formed is solved by controlling the remaining stress in the AlN underlayer. The following explanation illustrates an example where an AlN layer and a GaN layer, each of which includes hexagonal crystals with the C-axis orientation, are stacked on an Si substrate having (111)-orientation as a principal surface.

The film formation on the substrate 10 is performed with the following procedure.

As pretreatment, the substrate 10 is cleaned with a chemical liquid, before the substrate 10 is introduced into the reactor. Specifically, contaminants such as organic substances adhered onto the surface of the substrate 10 are removed using a chemical liquid such as sulfuric acid, hydrochloric acid, and hydrogen peroxide water. The cleaning step may be omitted when the surface of the substrate 10 has high cleanliness. In addition, a natural oxide film formed on the upper surface (principal surface) of the substrate 10 is removed using a solution such as hydrofluoric acid. The cleaning step may be omitted by performing high-temperature cleaning at about 1000° C. directly before the film formation step.

Then, after the substrate 10 is introduced into the reactor, pretreatment for film formation is performed with a temperature increased to temperature T0. The temperature T0 is, for example, 950° C. to 1100° C. In this step, the atmosphere in the reactor is preferably formed of nitrogen and/or hydrogen, with impurities such as moisture reduced as much as possible. A natural oxide film on the surface of the substrate 10 is removed by the pretreatment.

Next, a buffer layer 11 is formed on the substrate 10 by MOCVD. The buffer layer 11 is formed of a nitride semiconductor, and formed of aluminum nitride (AlN) in the present embodiment. The aluminum nitride (AlN) has an equivalent lattice spacing (hereinafter simply referred to as "lattice constant") smaller than that of silicon (Si) serving as the substrate 10. In addition, aluminum nitride (AlN) has a thermal expansion coefficient larger than that of silicon (Si).

Aluminum source gas and nitrogen source gas are used for film formation of AlN. For example, trimethylaluminum (Tri-Methyl-Aluminum: TMA, Al $(CH_3)_3$) is used as material of aluminum. For example, ammonia ($NH_3$) is used as material of nitrogen.

The buffer layer has a function of relaxing strain caused by difference in lattice constant between the nitride semiconductor layer formed on the buffer layer and the substrate, and controlling crystallinity of the nitride semiconductor layer formed on the buffer layer. The buffer layer also has a function of suppressing chemical reaction between the elements (such as gallium (Ga)) included in the nitride semiconductor layer formed on the buffer layer and the element (such as silicon (Si)) of the substrate.

The AlN layer 11 serving as the buffer layer is formed as follows. As illustrated in FIG. 4, a first AlN layer 11-1 is formed using temperature T1 in step S1. The temperature T1 is, for example, 500° C. to 900° C. The first AlN layer 11-1 preferably has a thickness of 10 nm to 200 nm. In step S1, because the first AlN layer 11-1 has a lattice constant smaller than that of the silicon substrate 10, tensile stress occurs in the first AlN layer 11-1 due to difference in lattice constant.

Next, in step S2, the temperature of the substrate 10 is decreased to temperature T2 (<T1). Thereafter, a second AlN layer 11-2 is formed using the temperature T2. The temperature T2 is, for example, 300° C. to 650° C. Otherwise, the temperature T2 is a temperature that is lower than the temperature T1 by 45° C. to 227° C. In the temperature decreasing step, for example, supply of the III group material (such as TMA) is stopped, and only supply of the V group material (such as $NH_3$) is continued, to stop film formation. Otherwise, in the temperature decreasing step, film formation may be continued by continuing supply of the III group material and the V group material.

In step S2, the first AlN layer 11-1 incurs thermal contraction greater than the substrate in temperature decrease. Consequently, a large tensile stress is applied to the first AlN layer 11-1. Tensile strain of 0.01% to 0.05% occurs in the first AlN layer 11-1, due to difference in temperature between T1 and T2 described above. The strain s in the case where the length of the sample having the initial length $L_0$ is changed to $L_1$ after application of stress thereto is indicated by the expression "$\epsilon=(L_1-L_0)/L_0=\lambda/L_0$". $\lambda$ denotes the change amount.

As a result, a crack or dislocation occurs in the first AlN layer 11-1. The probability of occurrence of a crack increases as the thickness of the first AlN layer increases or the difference in temperature between T1 and T2 increases. The second AlN layer 11-2 is formed in the above state. The second AlN layer 11-2 preferably has a thickness of 20 nm to 200 nm. The first AlN layer 11-1 preferably has a thickness smaller than the thickness of the second AlN layer 11-2. The total thickness of the first AlN layer 11-1 and the second AlN layer 11-2 is preferably 250 nm or less. A large total thickness causes a risk of occurrence of defects such as cracks.

In this step, a large tensile stress is applied also to the second AlN layer 11-2, and a new crack may be caused by the large tensile stress (tensile strain). The second AlN layer 11-2 becomes a close (fine) layer because it grows to fill cracks generated in temperature decrease or cracks generated in formation of the second AlN layer 11-2. In addition, in step S2, because the AlN layer grows while relaxing the tensile stress caused by occurrence of dislocation and the like, the tensile stress in the second AlN layer 11-2 is relaxed (the second AlN layer 11-2 is subjected to lattice relaxation). In this step, the tensile stress is relaxed also due to the occurrence of cracks.

In the present embodiment, it is most important to relax the tensile stress accumulated in the lattice (crystal lattice). In addition, relaxation of tensile stress by introduction of dislocation is more advantageous for the following steps than relaxation of tensile stress by occurrence of cracks. To achieve such, it is preferred to promote relaxation of tensile stress by introducing dislocations in formation of the second AlN layer 11-2, while a large tensile stress is accumulated without occurrence of cracks during temperature decrease in step S2. Specifically, it is desirable to reduce the thickness of the first AlN layer 11-1, and to increase the difference in temperature (difference between T1 and T2) in the temperature decrease. More specifically, it is preferred to set the thickness of the first AlN layer 11-1 to 10 nm to 50 nm, and the difference in temperature during temperature decrease to fall within the range of 114° C. to 227° C. The tensile strain applied to the first AlN layer 11-1 in this state is 0.025% to 0.05%.

Next, in step S3, the temperature of the substrate 10 is increased to temperature T3 (>T1). The temperature T3 is, for example, 750° C. to 1050° C. The difference in temperature between T2 and T3 (difference in temperature during temperature increase) is set larger than the difference in temperature (difference in temperature during temperature decrease) between T1 and T2. The difference in temperature between T2 and T3 is preferably set to 91° C. to 340° C. In the temperature increasing step, for example, supply of the III group material (such as TMA) is stopped, and only supply of the V group material (such as $NH_3$) is continued, to stop film formation. Otherwise, in the temperature increasing step, film formation may be continued by continuing supply of the III group material and the V group material.

In step S3, because the AlN layers 11-1 and 11-2 incur thermal expansion in temperature increase, compressive stress is generated in the AlN layers 11-1 and 11-2. In this step, compressive strain of 0.02% to 0.075% is applied to the second AlN layer 11-2 due to the above temperature increase. Because the second AlN layer 11-2 having crystals that are fine and include relaxed tensile stress is formed in step S2, a large compressive stress can be generated in the second AlN layer 11-2 in step S3.

Next, in step S4, a third AlN layer 11-3 is formed using the temperature T3. Because the third AlN layer 11-3 is formed at high temperature (temperature T3), compressive stress is continuously applied to the third AlN layer 11-3. In addition, in step S4, a crystal film of good quality can be obtained because of high film formation temperature. The thickness of the third AlN layer 11-3 in step S4 is preferably 50 nm to 300 nm. The total thickness of the AlN layers 11-1 to 11-3 is preferably 200 nm to 500 nm.

As described above, the AlN layer 11 (AlN layers 11-1 to 11-3) are formed on the substrate 10. A large compressive stress is accumulated in the AlN layer 11 by using the manufacturing process according to the present embodiment. In addition, the lattice spacing of the AlN layer in the present embodiment has a smaller value in the in-plane direction than that of the AlN crystals of the equivalent temperature due to the applied compressive stress.

Figure 6:
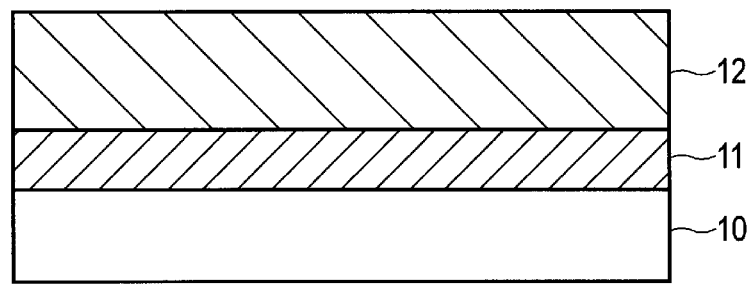
FIG. 6 is a cross-sectional view for explaining a manufacturing step of the semiconductor device according to the first embodiment.

Next, as illustrated in FIG. 6, in step S5, a nitride semiconductor layer 12 is formed on the AlN layer 11 by MOCVD. The nitride semiconductor layer 12 is formed using the temperature T3. In the present embodiment, the nitride semiconductor layer 12 is formed of gallium nitride (GaN). Gallium nitride has a lattice constant larger than that of aluminum nitride (AlN) serving as the buffer layer 11.

Gallium (Ga) source gas and nitrogen (N) source gas are used for film formation of GaN. For example, trimethylgallium (Tri-Methyl-Gallium: TMG, Ga $(CH_3)_3$) is used as the material of gallium (Ga). For example, ammonia ($NH_3$) is used as the material of nitrogen (N).

In step S5, because the GaN layer 12 having a lattice constant larger than that of the AlN layer 11 is formed by epitaxial growth on the AlN layer 11 in which a large compressive stress is generated, a larger compressive stress can be accumulated in the GaN layer 12, as illustrated in FIG. 4.

Thereafter, film formation of the GaN layer 12 is finished, and the temperature of the substrate 10 is decreased to the room temperature. In this treatment, although the GaN layer 12 incurs thermal contraction, because a large compressive stress is accumulated in the GaN layer 12, no tensile stress is applied to the GaN layer 12 even after the temperature is decreased, and the compressive stress is maintained. Thereby, the substrate maintains a convex shape, and deterioration of the GaN layer 12 is suppressed, that is, occurrence of cracks in the GaN layer 12 and breakage of part of the GaN layer 12 are suppressed.

(Example of Structure of Semiconductor Device 1)

Figure 7:
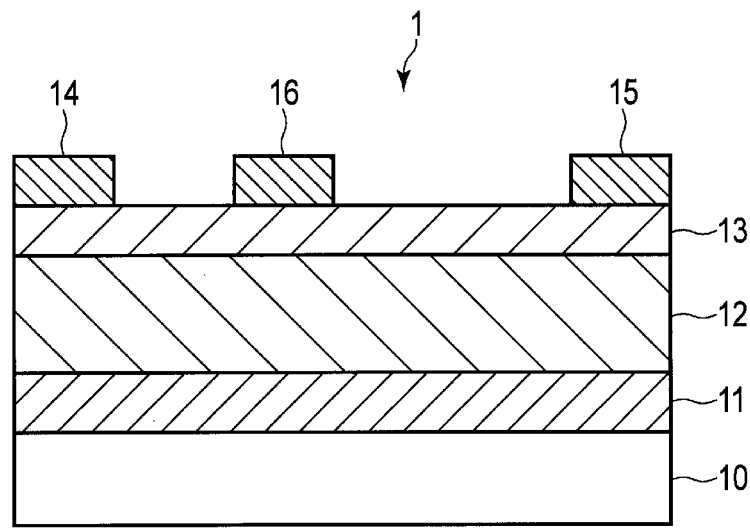
FIG. 7 is a cross-sectional view of a(the?) semiconductor device.

In actual manufacturing, desired layers are stacked on the nitride semiconductor layer 12 to manufacture the semiconductor device 1. The present embodiment illustrates an example where the semiconductor device 1 is a HEMT. FIG. 7 is a cross-sectional view of the semiconductor device 1. The nitride semiconductor layer 12 functions as a channel layer in which a channel (current path) is formed.

A barrier layer 13 is formed on the nitride semiconductor layer 12. The barrier layer 13 is formed of a nitride semiconductor having a band gap larger than that of the channel layer 12. In the present embodiment, the barrier layer 13 is formed of, for example, AlGaN.

A source electrode 14 and a drain electrode 15 are provided apart from each other on the barrier layer 13. A gate electrode 16 is provided on the barrier layer 13 and between the source electrode 14 and the drain electrode 15, apart from the source electrode 14 and the drain electrode 15.

A Schottky junction is formed between the gate electrode 16 and the barrier layer 13. Specifically, the gate electrode 16 is configured to include a material that forms a Schottky junction with the barrier layer 13. The semiconductor device 1 illustrated in FIG. 7 is a Schottky barrier type HEMT. For example, a layered structure of Au/Ni is used as the gate electrode 16. The left part of "/" indicates the upper layer, and the right part indicates the lower layer. The semiconductor device 1 is not limited to a Schottky barrier type HEMT, but may be a metal insulator semiconductor (MIS) type HEMT in which a gate insulating film is interposed between the barrier layer 13 and the gate electrode 16.

The source electrode 14 is in ohmic contact with a two-dimensional electron gas layer formed in a lower portion of the barrier layer 13. In the same manner, the drain electrode 15 is in ohmic contact with the two-dimensional electron gas layer formed in the lower portion of the barrier layer 13. Specifically, each of the source electrode 14 and the drain electrode 15 is formed to include a material that is in ohmic contact with the barrier layer 13. For example, a layered structure of Al/Ti is used as the source electrode 14 and the drain electrode 15.

Comparative Example

Figure 8:
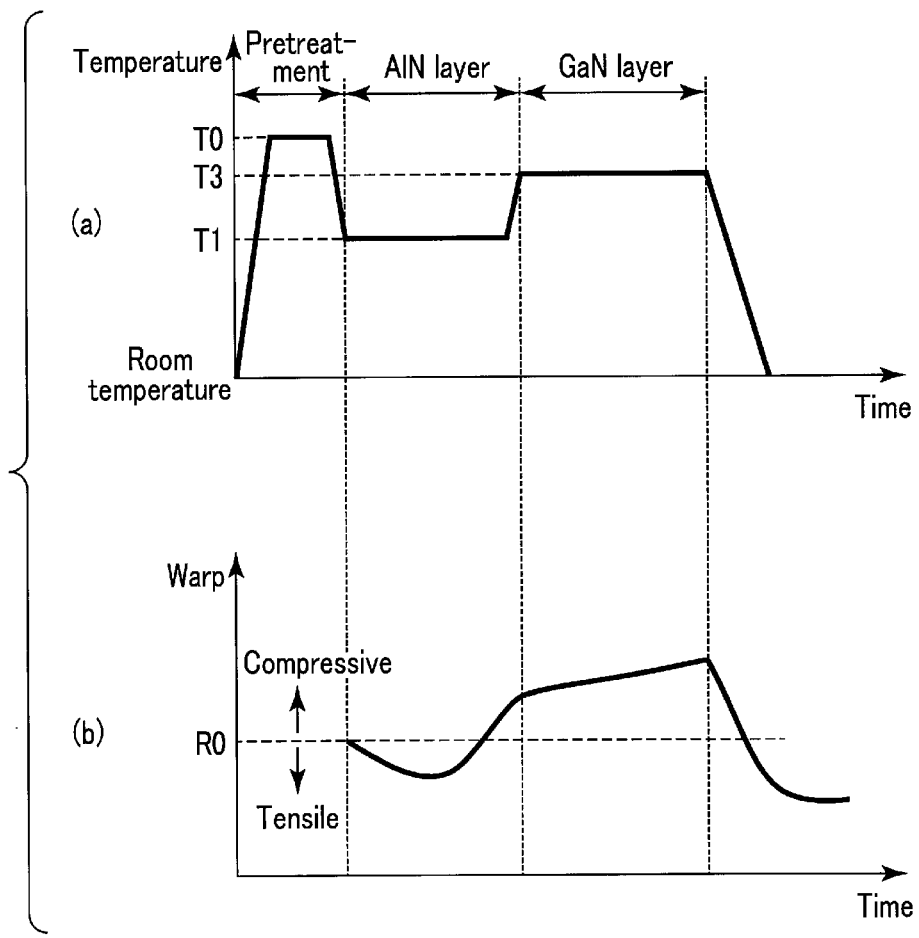
FIG. 8 is a diagram for explaining a manufacturing method of a semiconductor device according to a comparative example.

FIG. 8 is a diagram for explaining a manufacturing method of a semiconductor device according to a comparative example. Also in the comparative example, an AlN layer and a GaN layer are formed by MOCVD.

The AlN layer is formed using the temperature T1. The temperature T1 is, for example, 500° C. to 900° C. Because the AlN layer has a lattice constant smaller than that of the silicon substrate, tensile stress is generated in the AlN layer due to the difference in lattice constant.

In the manufacturing process of the comparative example, no large compressive stress can be accumulated in the AlN layer. The lattice spacing of the AlN layer in the comparative example does not have a sufficiently small value in comparison with that of AlN crystals at the equivalent temperature.

Next, a GaN layer is formed on the AlN layer using the temperature T3. The temperature T3 is, for example, 750° C. to 1050° C. In this Step, because a GaN layer having a lattice constant larger than that of the AlN layer is formed by epitaxial growth on the AlN layer in which tensile stress remains, sufficiently large compressive stress cannot be generated in the GaN layer.

Thereafter, film formation of the GaN layer is finished, and the temperature of the substrate is decreased to the room temperature. In this step, because the compressive stress accumulated in the GaN layer is not large, the compressive stress may not be maintained after the temperature is decreased. In addition, a large tensile stress may remain in the end, which causes cracks in the GaN layer.

FIG. 9 is a diagram illustrating a manufacturing method of a semiconductor device according to another comparative example. In the comparative example illustrated in FIG. 9, the AlN layer is formed using only temperature T3.

As illustrated in FIG. 9, although a slight compressive stress is accumulated in film formation of the AlN layer, tensile stress remains in the end after the temperature of the substrate is decreased.

(Effect)

To reduce a warp in the semiconductor device, it is necessary to accumulate a large compressive stress in the GaN layer in film formation. In addition, it is desirable to prepare an AlN layer having small lattice spacing, before film formation of the GaN layer. However, the AlN layer formed on the silicon substrate may have increased lattice spacing due to tensile stress applied thereto. In such a case, large compressive stress cannot be applied to the GaN layer having lattice spacing slightly larger than that of AlN crystals.

In the first embodiment, the first nitride semiconductor layer (AlN layer) 11 serving as the buffer layer and the second nitride semiconductor layer (GaN layer) 12 are formed in this order on the silicon substrate 10 by MOCVD or the like. In the step of forming the AlN layer 11, the first AlN layer 11-1 is formed using the temperature T1, and thereafter the second AlN layer 11-2 is formed using the temperature T2 (<T1). In the formation, tensile stress is applied to the AlN layer, and the second AlN layer 11-2 which has better quality (and is formed of a fine layer) and in which tensile stress is relaxed is formed by continuing film formation. Then, the temperature of the substrate 10 is increased to the temperature T3 (>T1), and the third AlN layer 11-3 is formed. Thereafter, the GaN layer 12 having a lattice constant larger than that of the AlN layer 11 is formed using the temperature T3.

Figure 10:
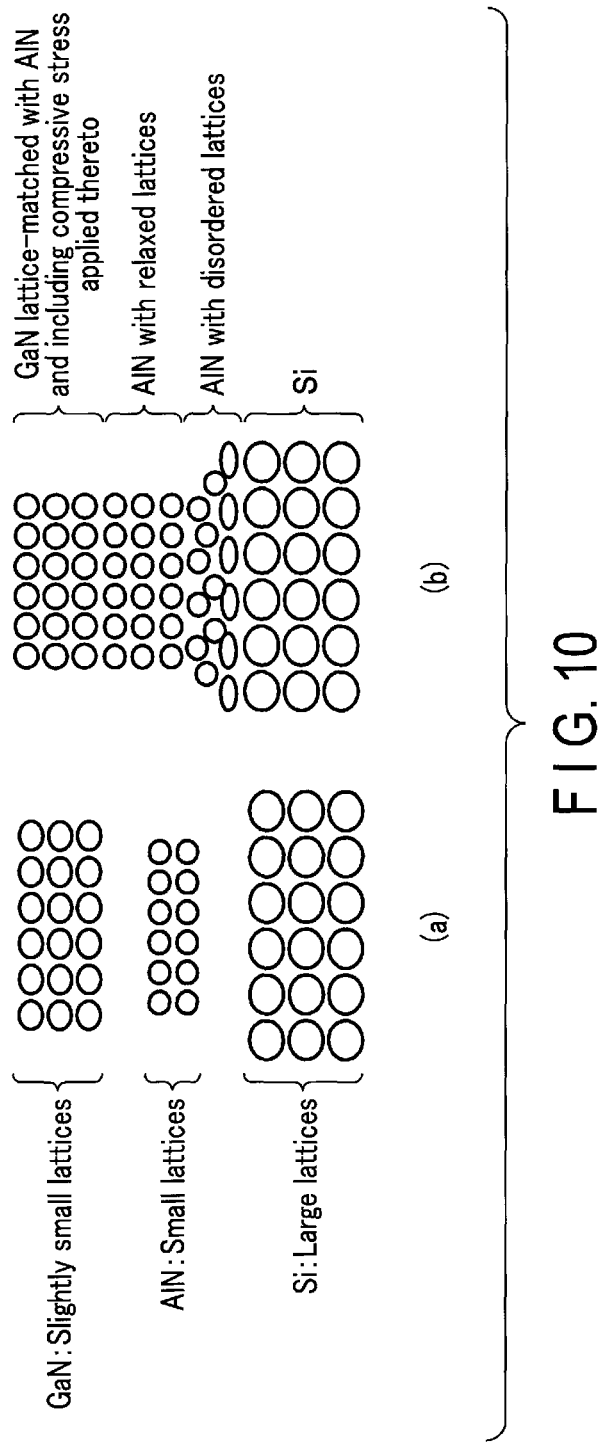
FIG. 10 is a schematic diagram for explaining crystal structures of an Si substrate, an AlN layer, and a GaN layer.

FIG. 10 is a schematic diagram for explaining crystal structures of the Si substrate 10, the AlN layer 11, and the GaN layer 12. As illustrated in FIG. 10 (a), the relation "Si>GaN>AlN" exists between the lattice constant of the Si substrate 10, the lattice constant of the AlN layer 11, and the lattice constant of the GaN layer 12.

The layered structure illustrated in FIG. 10 (b) is obtained by using the manufacturing method according to the present embodiment. The AlN layer 11 formed on the Si substrate 10 is formed of AlN (corresponding to the AlN 11-1 and 11-2) including disordered lattices due to tensile stress, and AlN (corresponding to AlN 11-3) with relaxed lattices. The GaN layer 12 that is lattice-matched with AlN and including compressive stress applied thereto is formed on the AlN layer 11.

With this structure, because the first embodiment enables accumulation of a large compressive stress in the GaN layer 12, the compressive stress of the GaN layer 12 is maintained even after the temperature of the substrate is decreased. Thereby, the first embodiment enables reduction in warp in the semiconductor device 1.

The first embodiment also suppresses occurrence of cracks and dislocation in the GaN layer 12, and thereby enables obtaining GaN layer 12 with excellent crystal quality. As a result, the first embodiment enables improvement in the performance of the semiconductor device 1.

Second Embodiment

In the second embodiment, the third AlN layer 11-3 included in the AlN layer 11 is grown at higher temperature than that in the first embodiment, to further increase the compressive stress generated in the AlN layer 11.

Figure 11:
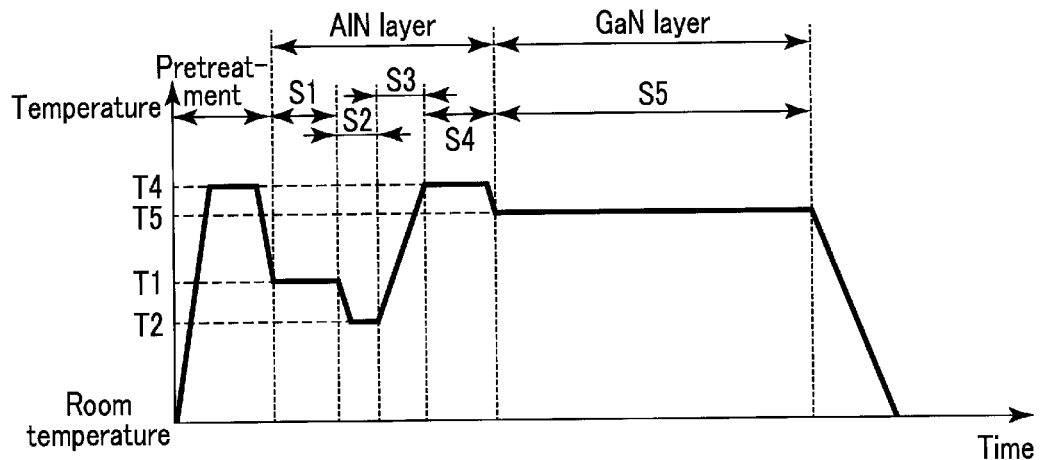
FIG. 11 is a diagram for explaining a manufacturing method of a semiconductor device according to a second embodiment.

FIG. 11 is a diagram for explaining a manufacturing method of a semiconductor device 1 according to the second embodiment. The manufacturing process up to step S2 in FIG. 11 is the same as the manufacturing process up to step S2 in FIG. 4. The cross-sectional view for explaining the manufacturing method of the semiconductor device 1 is the same as FIG. 5.

In step S3, the temperature of the substrate 10 is increased to temperature T4. The temperature T4 is, for example, 750° C. to 1100° C. The temperature T4 may be the same as the pretreatment temperature T0 before the film formation. The temperature T4 preferably does not exceed the temperature T0.

In step S3, the temperature of the substrate 10 is increased to the temperature T4 that is higher than the temperature T3. With the temperature T4, because the AlN layers 11-1 and 11-2 incur larger thermal expansion in temperature increase in step S3, a larger compressive stress is generated in the AlN layers 11-1 and 11-2. In addition, because the fine second AlN layer 11-2 including crystals with relaxed tensile stress is formed in step S2, a large compressive stress can be generated in the second AlN layer 11-2 in step S3.

Then, in step S4, the third AlN layer 11-3 is formed using the temperature T4. The AlN layer 11 is formed on the substrate 10 in this manner. Because the third AlN layer 11-3 is formed at high temperature (temperature T4), compressive stress is generated in the third AlN layer 11-3. In addition, because high film formation temperature is used in step S4, a crystal film with good quality can be obtained.

Next, in step S5, the GaN layer 12 is formed on the AlN layer 11 using temperature T5 (<T4). The temperature T5 is set to the same range as that of the temperature T3. The temperature T5 preferably does not exceed the temperature T0. In step S5, because the GaN layer 12 having a lattice constant larger than that of the AlN layer 11 is formed by epitaxial growth on the AlN layer 11 in which a large compressive stress is generated, a large compressive stress can be accumulated in the GaN layer 12. The subsequent manufacturing steps are the same as those of the first embodiment.

As detailed above, according to the second embodiment, the third AlN layer 11-3 included in the AlN layer 11 is formed using the temperature T4 (>T5). With this structure, a larger compressive stress can be accumulated in the AlN layer 11. As a result, a warp in the semiconductor device 1 can be further reduced in comparison with the first embodiment. In addition, the second embodiment enables formation of the AlN layer 11 with good crystal quality. The other effects thereof are the same as those of the first embodiment.

Third Embodiment

The third embodiment illustrates an example of a structure of a universal substrate (AlN template substrate) in which only the AlN layer 11 is formed on the Si substrate. The AlN template substrate can be used as a base substrate for preparing a GaN-on-Si structure for general purposes. The compressive stress generated in the AlN layer 11 is designed to further increase compressive stress applied to the GaN layer stacked thereon. The cross-sectional view of the semiconductor device (AlN temperature substrate) 1 according to the third embodiment is the same as FIG. 5.

The manufacturing method of the semiconductor 1 according to the third embodiment is the same as the manufacturing process from the pretreatment to step S4 explained in the first and the second embodiments. After step S4 is finished, the temperature is decreased, and the substrate is taken out of the reactor. Because the AlN layer incurs thermal contraction, the compressive stress accumulated up to that time becomes weak. As a result, the substrate having a large convex warp becomes close to a flat shape, or changes to a concave shape with a small warp by a manufacturing condition. The substrate can be used as a universal template substrate for forming a GaN-on-Si structure.

Generally, in an MOCVD reactor for film formation of an LED structure or the like, the pressure in the furnace is set to 100 Torr or around. However, under the above condition, a minor reaction may occur with trimethylaluminum (TMA) serving as the Al material, and trimethylaluminum may not contribute to growth. For this reason, the supply amount of TMA cannot be increased, which makes it difficult to increase the growth speed. The AlN template substrate can be efficiently prepared by using a furnace dedicated to AlN film formation with the pressure in the furnace reduced to approximately 1 Torr. In addition, with the furnace dedicated to AlN film formation, because no Ga material (Ga atoms) is mixed into the furnace, it is possible to suppress melt-back etching in which Ga reacts with Si on the Si substrate before formation of the AlN layer, and form an AlN substrate with better quality.

When the AlN template substrate prepared according to the present embodiment is introduced into the MOCVD reactor again, and the temperature of the substrate is increased to the temperature T3 to continue the process of step S5 and the subsequent steps in the first embodiment, a large compressive stress is generated due to thermal expansion of the AlN layer, and thereby the warp of the substrate becomes greatly convex. Then, when GaN is stacked in step S5, a larger compressive stress can be accumulated in the same manner as the first embodiment.

By contrast, when the AlN template substrate is prepared by the same method as in the comparative examples, the compressive stress of the AlN layer does not remain and the tensile stress is applied when the temperature of the substrate is decreased and the substrate is taken out of the furnace after formation of the AlN layer. Therefore, a downward warp occurs in the substrate. Even when the substrate is introduced into the MOCVD reactor again and the process of step S13 and the subsequent steps is continued, no large compressive stress can be applied to the GaN layer.

In the case of preparing an AlN template substrate by depositing the AlN layer on the Si substrate, using sputtering with the film formation temperature of about 300° C. or less enables preparation of the template substrate without occurrence of large tensile stress in the AlN layer, with a small difference in temperature during temperature decrease after film formation. However, if the AlN layer is formed only at low temperature, the problem that crystal quality of the AlN layer is poor still remains.

By contrast, the AlN template substrate prepared according to the present embodiment enables satisfaction of both a demand for internal tensile stress in the AlN layer and a demand for crystallinity. For example, the present embodiment enables acquisition of a crystal layer having a half-width of X-ray diffraction of 1200 seconds or less serving as an index of crystallinity in the AlN layer of (0002)-orientation, as crystallinity of the AlN layer, in a state of including a tensile stress that makes the substrate concave with a warp amount of 15 μm or less when the wafer size (diameter) is converted into 200 mm, in a structure where a C-axis oriented ((0001) direction) AlN layer having a thickness of 500 nm or less is stacked on an Si substrate having (111)-orientation. In particular, because warps become a large problem when the wafer size is increased, the present embodiment is particularly effective in a specific structure having a wafer size of 200 mm or more.

(Evaluation of Crystallinity Using X-Ray Diffraction)

Figure 12:
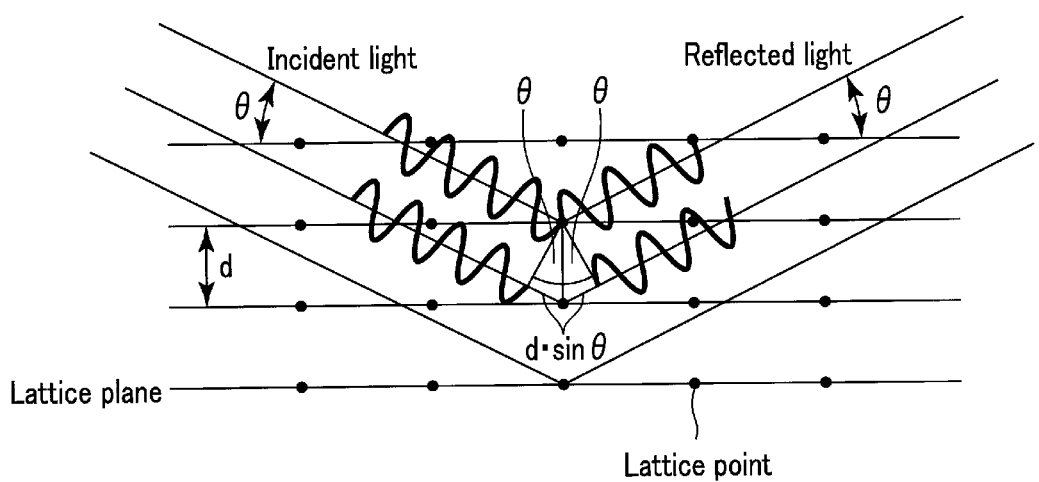
FIG. 12 is a diagram for explaining evaluation of crystallinity by X-ray diffractometry.

X-ray diffraction can be used for evaluation of crystallinity of the growth layer. Generally, a half-width of the X-ray diffraction peak is used as an index for evaluating crystallinity of the obtained growth layer. When X-rays having uniformly aligned wavelengths are applied to a crystal sample having lattice spacing d, the diffraction peaks are observed in the direction of an angle θ (FIG. 12), for the wavelength λ of the X-rays, in accordance with parallel arrangement of the crystal lattices, with the following relation:

$$\lambda = 2d \cdot \sin\theta.$$

In the X-ray diffraction, when the crystal lattice arrangement is completely parallel, the diffraction angle has a fixed value. However, when the arrangement is disordered, the diffraction angle spreads (half-width). Specifically, the half-width can be used as an index of disorder of the arrangement. In the evaluation, it is necessary to designate the lattice arrangement on which diffraction is to be performed among the crystals. Generally, although (0002)-orientation is simply designated in hexagonal nitride semiconductor crystals, comprehensive evaluation may be made to include the other surfaces.

Another method for evaluating the quality of crystals is a method of measuring a dislocation density. Dislocation appears when the position of a lattice is dislocated from its original position due to stress in the crystal and the dislocation is transmitted. This can be observed by a method such as a transmission electron microscope. When the position of the lattice is dislocated and the dislocation is transmitted, disorder of the lattice arrangement results, and therefore the dislocation density is highly correlated with the above X-ray half-width.

Although the present embodiment illustrates the process in which film formation is performed by MOCVD, the present embodiment is not limited to it. Other film formation methods can be used, such as RF-MBE (a film formation method based on molecular beam epitaxy in which an ammonia material is decomposed by a high-frequency source to be supplied).

The term "nitride semiconductor" in the present specification includes semiconductors of all compositions in the chemical formula "$In_xAl_yGa_{(1-x-y)}N$ (0≤x≤1, 0≤y≤1, 0≤x+y≤1)" in which the composition ratio of x and y is changed within these ranges. The term "nitride semiconductor" also includes semiconductors further including a V-group element other than N (nitrogen), semiconductors further including various elements added to control various physical properties such as a conductive type, and semiconductors further including various elements included without intension, in the above chemical formula.

In the specification of the present application, the terms "stacked" and "layered" include the case where the layers are stacked with another layer inserted therebetween, as well as the case where the layers are stacked to contact each other. The term "provided on" includes the case where one is provided on the other with another layer interposed therebetween, as well as the case where they are provided to contact each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:

forming a first nitride semiconductor layer on a substrate using a first temperature;

decreasing a substrate temperature to a second temperature lower than the first temperature, after the forming the first nitride semiconductor layer;

forming a second nitride semiconductor layer on the first nitride semiconductor layer using the second temperature, the second nitride semiconductor layer formed of a material identical to a material of the first nitride semiconductor layer;

increasing the substrate temperature to a third temperature higher than the first temperature, after the forming the second nitride semiconductor layer; and forming a third nitride semiconductor layer on the second nitride semiconductor layer using the third temperature, the third nitride semiconductor layer formed of a material identical to the material of the first nitride semiconductor layer.

2. The method of claim 1, further comprising:

forming a fourth semiconductor layer on the third nitride semiconductor layer, the fourth semiconductor layer formed of a material different from the material of the first nitride semiconductor layer.

3. The method of claim 2, wherein the fourth semiconductor layer is a nitride semiconductor layer.

4. The method of claim 2, wherein the forming the fourth semiconductor layer is performed using the third temperature.

5. The method of claim 2, wherein the forming the fourth semiconductor layer is performed using a fourth temperature higher than the first temperature and lower than the third temperature.

6. The method of claim 5, wherein
the first temperature is 500° C. to 900° C.,
the second temperature is 300° C. to 650° C.,
the third temperature is 750° C. to 1100° C., and
the fourth temperature is 750° C. to 1050° C.

7. The method of claim 2, wherein the fourth semiconductor layer has a lattice constant smaller than a lattice constant of the first nitride semiconductor layer.

8. The method of claim 2, wherein
the substrate is formed of a silicon substrate,
the first nitride semiconductor layer is formed of aluminum nitride, and
the fourth semiconductor layer is formed of gallium nitride.

9. The method of claim 1, wherein a difference between the second temperature and the third temperature is larger than a difference between the first temperature and the second temperature.

10. The method of claim 1, wherein
the first temperature is 500° C. to 900° C.,
the second temperature is 300° C. to 650° C., and
the third temperature is 750° C. to 1050° C.

11. The method of claim 1, wherein a difference between the first temperature and the second temperature is 45° C. to 227° C.

12. The method of claim 1, wherein a difference between the second temperature and the third temperature is 91° C. to 340° C.

13. The method of claim 1, wherein
in the decreasing, tensile strain of 0.01% to 0.05% is generated in the first nitride semiconductor layer, and
in the increasing, compressive strain of 0.02% to 0.075% is generated in the second nitride semiconductor layer.

14. The method of claim 1, wherein
the first nitride semiconductor layer has a thickness of 10 nm to 200 nm,
the second nitride semiconductor layer has a thickness of 20 nm to 200 nm, and
the third nitride semiconductor layer has a thickness of 50 nm to 300 nm.

15. The method of claim 1, wherein the first nitride semiconductor layer has a thickness smaller than a thickness of the second nitride semiconductor layer.

16. The method of claim 1, wherein the forming the first to third nitride semiconductor layers are performed by using MOCVD (Metal Organic Chemical Vapor Deposition).

17. The method of claim 1, wherein a difference between the first temperature and the second temperature is set to cause lattice relaxation in the second nitride semiconductor layer.

18. The method of claim 1, wherein a difference between the third temperature and the first temperature is set to cause compressive stress in the third nitride semiconductor layer.

19. A manufacturing method of a semiconductor device, comprising:

forming a first nitride semiconductor layer on a substrate such that tensile stress is generated in the first nitride semiconductor layer;

forming a second nitride semiconductor layer on the first nitride semiconductor layer such that lattices are relaxed in the second nitride semiconductor layer, the second nitride semiconductor layer formed of a material identical to a material of the first nitride semiconductor layer; and forming a third nitride semiconductor layer on the second nitride semiconductor layer such that compressive stress is generated in the third nitride semiconductor layer, the third nitride semiconductor layer formed of a material identical to the material of the second nitride semiconductor layer.

20. The method of claim 19, further comprising:

forming a fourth semiconductor layer on the third nitride semiconductor layer such that compressive stress is generated in the fourth semiconductor layer, the fourth semiconductor layer formed of a material different from the material of the first nitride semiconductor layer.

* * * * *